United States Patent
Qiao et al.

(10) Patent No.: US 11,355,876 B2
(45) Date of Patent: Jun. 7, 2022

(54) ELECTRICAL CONNECTOR FOR PRINTED CIRCUIT BOARDS

(71) Applicant: 3M INNOVATIVE PROPERTIES COMPANY, St. Paul, MN (US)

(72) Inventors: YunLong Qiao, Singapore (SG); Saujit Bandhu, Singapore (SG); Johannes P. M. Kusters, Austin, TX (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 17/159,602

(22) Filed: Jan. 27, 2021

(65) Prior Publication Data
US 2021/0151917 A1 May 20, 2021

Related U.S. Application Data

(62) Division of application No. 16/301,991, filed as application No. PCT/US2017/030336 on May 1, 2017, now Pat. No. 10,938,135.
(Continued)

(51) Int. Cl.
*H01R 12/70* (2011.01)
*H01R 12/72* (2011.01)
*H05K 3/36* (2006.01)

(52) U.S. Cl.
CPC ......... *H01R 12/721* (2013.01); *H01R 12/724* (2013.01); *H05K 3/368* (2013.01);
(Continued)

(58) Field of Classification Search
CPC .......... H01R 12/721; H01R 12/722724; H01R 12/72; H01R 12/71; H01R 12/70;
(Continued)

(56) References Cited

U.S. PATENT DOCUMENTS 4,623,207 A * 11/1986 Sasaki ................ H01R 12/7082
439/631
5,085,601 A * 2/1992 Buchter ................ H01R 12/82
439/79
(Continued)

FOREIGN PATENT DOCUMENTS

CN 2547020 4/2003
CN 201167192 12/2008
(Continued)

OTHER PUBLICATIONS

International Search Report for PCT International Application No. PCT/US2017/030336, dated Aug. 16, 2017, 4 pages.

*Primary Examiner* — Harshad G Patel
(74) *Attorney, Agent, or Firm* — Jonathan L. Tolstedt (57) ABSTRACT

An electrical connector provides electrical connection between first, second, and third printed circuit boards (PCBs). The connector defines spaced apart substantially parallel, first, second and third mating slots and includes a plurality of pairs of first terminals and a plurality of pairs of second terminals. For each pair of first terminals: the first terminals are electrically connected to each other; one of the first terminals is disposed in the first mating slot; and the other of the first terminals is disposed in the third mating slot. For each pair of second terminals: the second terminals are electrically isolated from each other; one of the second terminals is disposed in the second mating slot; and the other of the second terminals is disposed in the third mating slot. When first, second and third PCBs are received in the respective first, second and third mating slots, each pair of first terminals electrically connects corresponding traces of the first and third PCBs and each pair of second terminals electrically connects corresponding traces of the second and third PCBs.

4 Claims, 7 Drawing Sheets

US 11,355,876 B2
Page 2

Related U.S. Application Data (60) Provisional application No. 62/336,918, filed on May 16, 2016.

(52) U.S. Cl.
CPC .................. *H05K 2201/042* (2013.01); *H05K 2201/10189* (2013.01)

(58) Field of Classification Search
CPC ...... H05K 3/368; H05K 3/36; H05K 2201/04; H05K 7/042; H05K 2201/10189
USPC .......................... 439/630, 63, 541.5, 626, 676
See application file for complete search history.

(56) References Cited

U.S. PATENT DOCUMENTS

| | | | | |
|---|---|---|---|---|
| 5,295,843 A * | 3/1994 | Davis | ................ | H01R 13/6485 439/924.1 |
| 6,086,427 A | 7/2000 | Cahaly | | |
| 6,273,757 B1 * | 8/2001 | David | ................ | H01R 13/6594 439/607.13 |
| 6,674,644 B2 * | 1/2004 | Schulz | ................... | H05K 1/117 361/728 |
| 6,835,091 B2 * | 12/2004 | Oleynick | ............. | H01R 13/658 439/541.5 |
| 7,445,505 B1 * | 11/2008 | Yi | ..................... | H01R 13/6485 439/181 |
| 7,517,253 B1 * | 4/2009 | Chiang | ................ | H01R 12/712 439/660 |
| 7,520,781 B2 * | 4/2009 | Clayton | ............... | H01R 12/721 439/631 |
| 7,604,490 B2 * | 10/2009 | Chen | .................. | H01R 13/6471 439/541.5 |
| 8,075,343 B2 * | 12/2011 | Fu | ........................ | H01R 12/732 439/328 |
| 8,206,174 B2 * | 6/2012 | Ko | ........................ | H01R 13/703 439/489 |
| 8,292,667 B1 * | 10/2012 | Huang | ................. | G06K 7/0021 439/541.5 |
| 8,535,069 B2 * | 9/2013 | Zhang | ................ | H01R 13/6471 439/607.05 |
| 2004/0048518 A1 | 3/2004 | Ruckerbauer | | |
| 2006/0134975 A1 * | 6/2006 | Osada | ................... | H01R 12/712 439/541.5 |
| 2008/0268702 A1 | 10/2008 | Little et al. | | |
| 2011/0244729 A1 | 10/2011 | Yamakami | | |
| 2020/0313323 A1 * | 10/2020 | Qiao | .................... | H01R 12/721 |

FOREIGN PATENT DOCUMENTS

| | | |
|---|---|---|
| CN | 201417837 | 3/2010 |
| CN | 201845904 | 5/2011 |
| CN | 203596429 | 5/2014 |
| CN | 203707391 | 7/2014 |

\* cited by examiner

ELECTRICAL CONNECTOR FOR PRINTED CIRCUIT BOARDS

TECHNICAL FIELD

This application relates to electrical connectors and electrical connector assemblies.

BACKGROUND

Electrical connectors are electro-mechanical devices typically including a mechanical housing supporting and/or partially enclosing electrical terminals. Electrical connectors are frequently used to electrically interconnect two electronic devices. Some electrical connectors provide electrical interconnection between the conductive traces disposed on two or more printed circuit boards (PCBs) disposed within the chassis of an electronic device.

BRIEF SUMMARY

Some embodiments involve an electrical connector for providing electrical connection between first, second, and third printed circuit boards (PCBs). The connector defines spaced apart substantially parallel, first, second and third mating slots. The connector includes a plurality of pairs of first terminals. For each pair of first terminals: the first terminals are electrically connected to each other; one of the first terminals is disposed in the first mating slot; and the other of the first terminals is disposed in the third mating slot. The connector includes a plurality of pairs of second terminals. For each pair of second terminals: the second terminals are electrically isolated from each other; one of the second terminals is disposed in the second mating slot; and the other of the second terminals is disposed in the third mating slot. When first, second and third PCBs are received in the respective first, second and third mating slots, each pair of first terminals electrically connects corresponding traces of the first and third PCBs and each pair of second terminals electrically connects corresponding traces of the second and third PCBs.

According to some embodiments, an electrical connector defines first and second mating slots with a wall separating the first mating slot from the second mating slot. A row of spaced apart flexible first terminals is disposed on a first side of the wall and communicates with the first mating slot. A row of spaced apart flexible second terminals is disposed on an opposite second side of the wall and communicates with the second mating slot. Each flexible first terminal corresponds to a flexible second terminal, such that corresponding first and second terminals can resiliently flex toward and make contact with one another through an opening defined within the wall.

In some embodiments, an electrical connector provides electrical connection between first and second printed circuit boards (PCBs). The connector defines first and second mating slots with at least one wall separating the first mating slot from the second mating slot. A row of spaced apart flexible first terminals is disposed on a first side of the at least one wall and communications with the first mating slot. A row of spaced apart flexible second terminals is disposed on an opposite second side of the at least one wall and communicates with the second mating slot. Each flexible second terminal corresponds to and is electrically connected to a different flexible first terminal. When first and second PCBs are received in the respective first and second mating slots, corresponding first and second terminals electrically connect corresponding traces of the first and second PCBs.

These and other aspects of the present application will be apparent from the detailed description below. In no event, however, should the above summaries be construed as limitations on the claimed subject matter, which subject matter is defined solely by the attached claims.

BRIEF DESCRIPTION OF THE DRAWINGS

The figures are not necessarily to scale. Like numbers used in the figures refer to like components. However, it will be understood that the use of a number to refer to a component in a given figure is not intended to limit the component in another figure labeled with the same number.

DESCRIPTION OF ILLUSTRATIVE EMBODIMENTS

Embodiments disclosed herein are directed to electrical connectors that are useful to electrically interconnect two or more printed circuit boards (PCBs). The two or more PCBs may be disposed within a housing or chassis, such as PCBs of a solid state drive (SSD) disposed within a SSD housing. Electrical connectors that are interconnected within the housing of an electronic device may have stringent size and/or position requirements. For example, PCBs may be arranged in a stacked configuration, as in an SSD device, to fit within the housing. In this scenario, stacked PCBs may be connected using a flexible cable or flexible PCB that bends to allow the stacking of the PCBs. In some scenarios, the PCBs may need to be located at a particular location within the housing, e.g., near a wall of the chassis, which impacts connectivity options. The use of flexible cables for interconnecting PCBs can be relatively expensive, as it involves a flexible cable and/or connector for each PCB that is connected to the PCB stack. Furthermore, the bend radius specification of flexible cables may present space or reliability considerations in a tightly confined chassis. Additionally, removing and inserting PCBs interconnected by flexible cables within a housing can be challenging for a user. Thus, it may be difficult for flexible cables to meet the stringent space, cost, reliability, and/or ease of use specifications for interconnecting PCBs in some applications.

Figure 1:
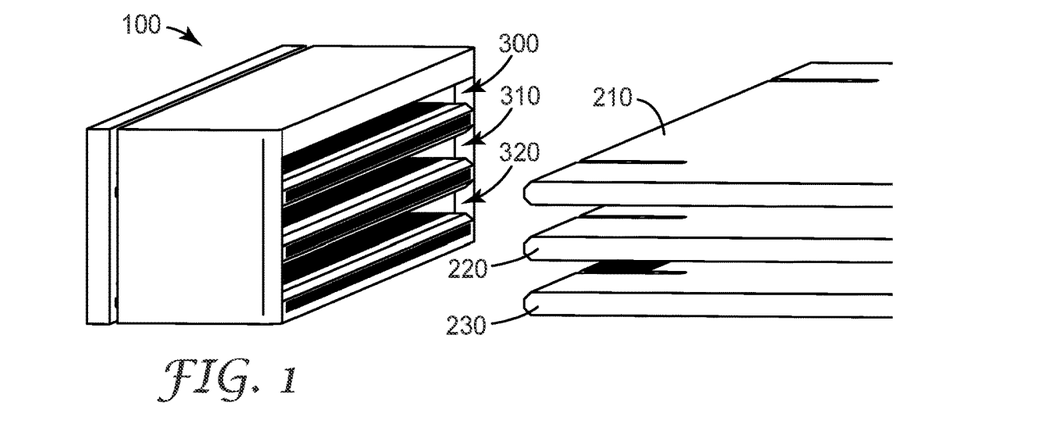
FIG. 1 shows an electrical connector according to some embodiments.

The electrical connectors disclosed herein provide an elegant and cost effective solution for interconnecting PCBs arranged in a stacked orientation within a chassis or housing. Turning now to FIG. 1, an electrical connector 100 provides an electrical connection between first 210, second 220, and third 230 printed circuit boards (PCBs). Connector 100 shown in FIG. 1 includes spaced apart and substantially parallel, first 300, second 310, and third 320 mating slots configured to accept PCBs 210, 220, and 230, respectively. It will be appreciated that a connector 100 having three mating slots is used here as an illustrative embodiment. It is possible to extend the approaches illustrated by embodiments described herein to connectors having more or fewer mating slots.

Figure 2A:
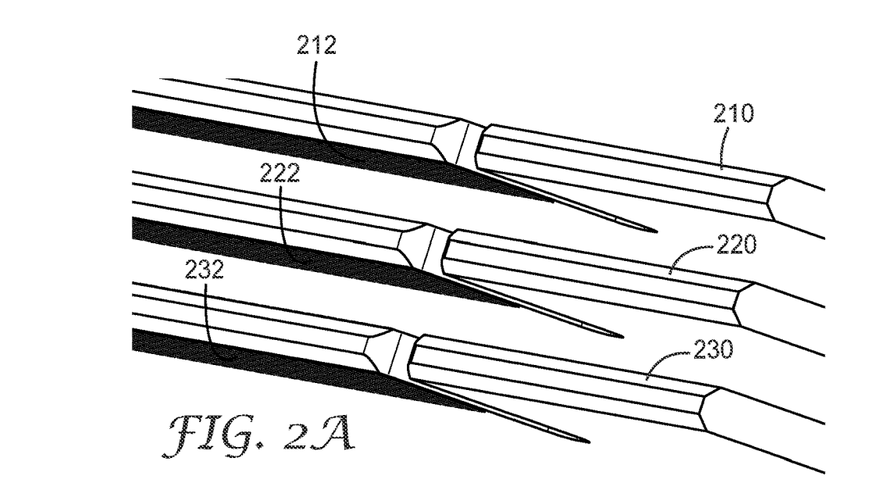
FIGS. 2A and 2B show printed circuit boards that can be inserted into the electrical connector of FIG. 1.
Figure 2B:
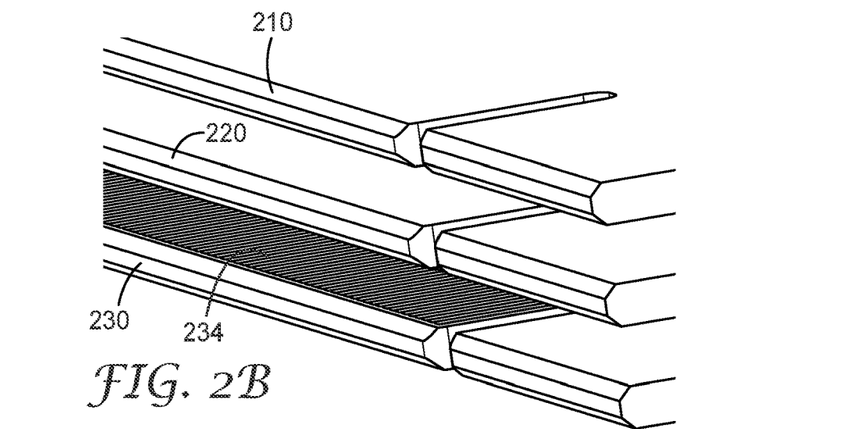

FIGS. 2A and 2B provide perspective views of PCBs 210-230 in accordance with some embodiments. As shown in FIGS. 2A and 2B, the PCBs may include electrical traces on one or both major surfaces of the PCBs. The first PCB 210 includes traces 212 on a lower surface of PCB 210. The second PCB 220 includes traces 222 on the lower surface of PCB 220. In this example, the third PCB 230 includes traces 232, 234 on both major surfaces of the third PCB 230. In this example, traces 234 face traces 222 of the second PCB 220.

Figure 3:
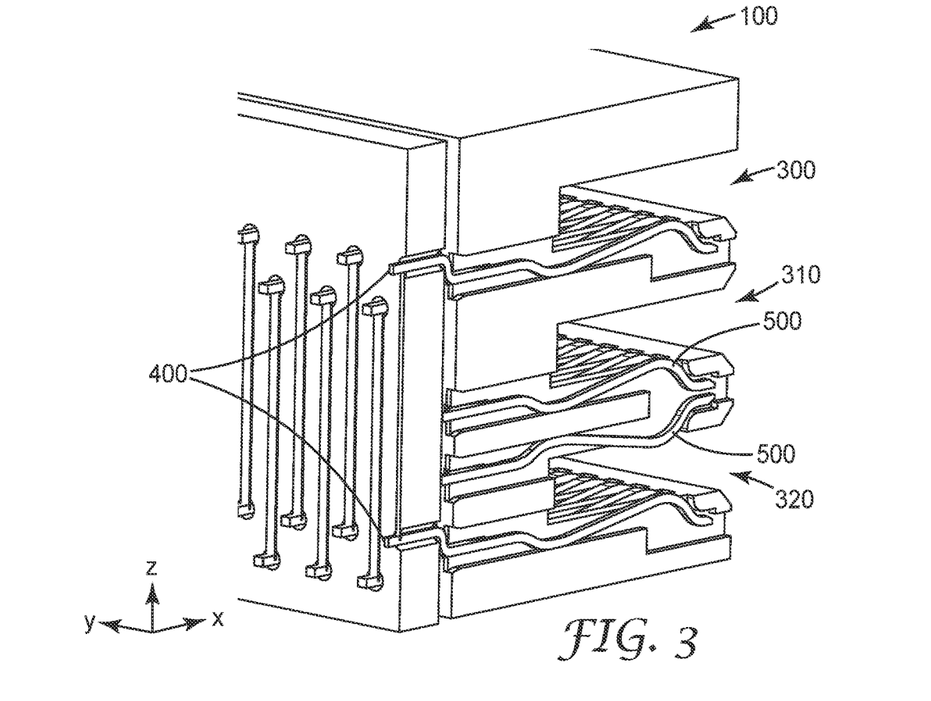
FIG. 3 provides a perspective view of the electrical connector of FIG. 1.
Figure 4A:
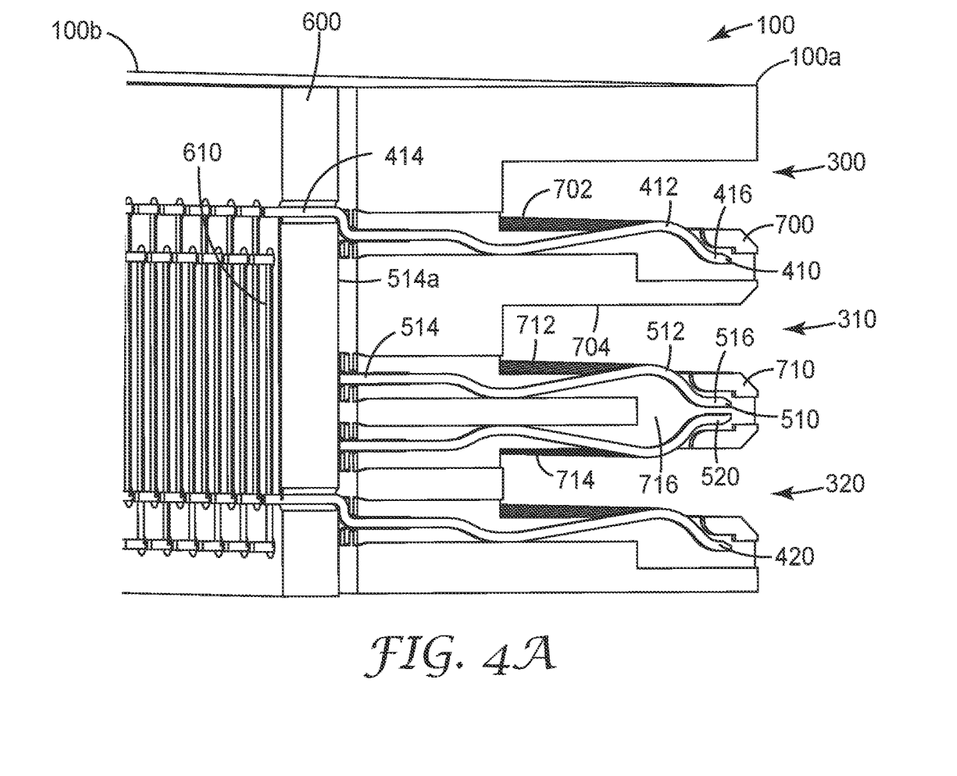
FIG. 4A shows an electrical connector having with an electrical trace that electrically connects terminals of the connector.

As illustrated in the perspective views of FIG. 3, and FIG. 4A, connector 100 includes one or more first pairs 400 of first terminals 410, 420 and one or more second pairs 500 of second terminals 510, 520. For example, the connector 100 may include a plurality of first pairs 400 of first terminals 410, 420 and a plurality of second pairs 500 of second terminals 510, 520 extending along the y axis as best seen in FIG. 3. For each pair 400 of first terminals, one of the first terminals 410 of the first pair 400 is disposed in the first mating slot 300 and the other of the first terminals 420 of the first pair 400 is disposed in the third mating slot 320. For each pair 500 of second terminals, one of the second terminals 510 of the second pair 500 is disposed in the second mating slot 310 and the other of the second terminals 520 of the second pair 500 is disposed in the third mating slot 320. The first terminals 410, 420 of each first pair 400 are electrically connected to each other by a conductor, e.g., by conductive trace 610 shown in FIG. 4A or C-shaped portion 620 shown in FIG. 4C. When the circuit boards 220, 230 are not inserted into the mating slots 310, 320, the second terminals 510, 520 of each pair 500 are electrically isolated from each other. Each second terminal 510, 520 may be electrically isolated from all other second terminals 510, 520 in the plurality of pairs 500 of second terminals 510, 520 and all first terminals 410, 420 in the plurality of pairs 400 of first terminals 410, 420.

As best seen in FIG. 4A, a first wall 700 separates the first mating slot 300 from the second mating slot 310. A second wall 710 separates the second mating slot 310 from the third mating slot 320. A first side 702 of the first wall 700 is exposed to the first mating slot 300. An opposite second side 704 of the first wall 700 faces a first side 712 of the second wall 710. The second side 704 of the first wall and the first side 712 of the second wall 710 are exposed to the second mating slot 310. An opposite second side 714 of the second wall 710 is exposed to the third mating slot 320. A row of spaced apart flexible terminals 410 of the terminal pair 400 are disposed on the first side 702 of the first wall 700 and communicate with the first mating slot 300. A row of spaced apart flexible terminals 420 of the terminal pair 400 face the second side 714 of the second wall and communicate with the third mating slot 320.

Connector 100 includes a mating end 100a and a non-mating end 100b, wherein openings of the mating slots 300, 310, 320 are arranged at the mating end 100a of the connector 100. In some embodiments, the connector 100 includes a bridge circuit board 600 arranged at the non-mating end 101b between terminals 410 and 420. The bridge circuit board 600 includes one or more conductive traces 610 extending between first terminals 410, 420. Each conductive trace 610 corresponds to and electrically interconnects a different pair 400 of first terminals 410, 420. Each pair 400 of first terminals 410, 420 electrically connects corresponding traces of the first 210 and third 230 PCBs by virtue of the corresponding electrically conductive trace 610 on the bridge circuit board 600 shown in FIG. 4A. In some implementations, the connector 100 includes a plurality of conductors 610, wherein each conductor 610 corresponds to and electrically interconnects a different pair 400 of first terminals 410, 420.

Figure 4B:
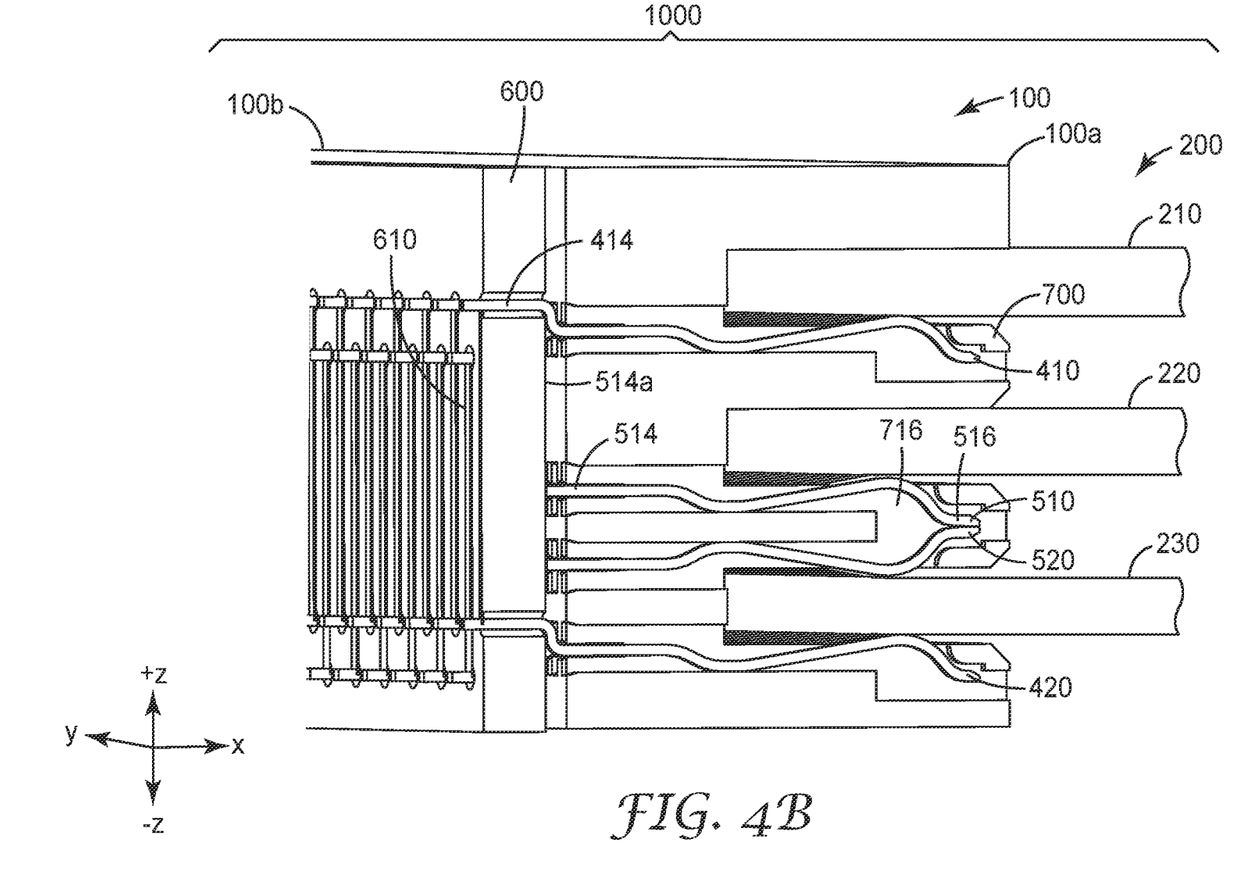
FIG. 4B illustrates an electrical connector assembly comprising the electrical connector of FIG. 4A with PCBs installed in the mating slots in accordance with some embodiments.
Figure 4C:
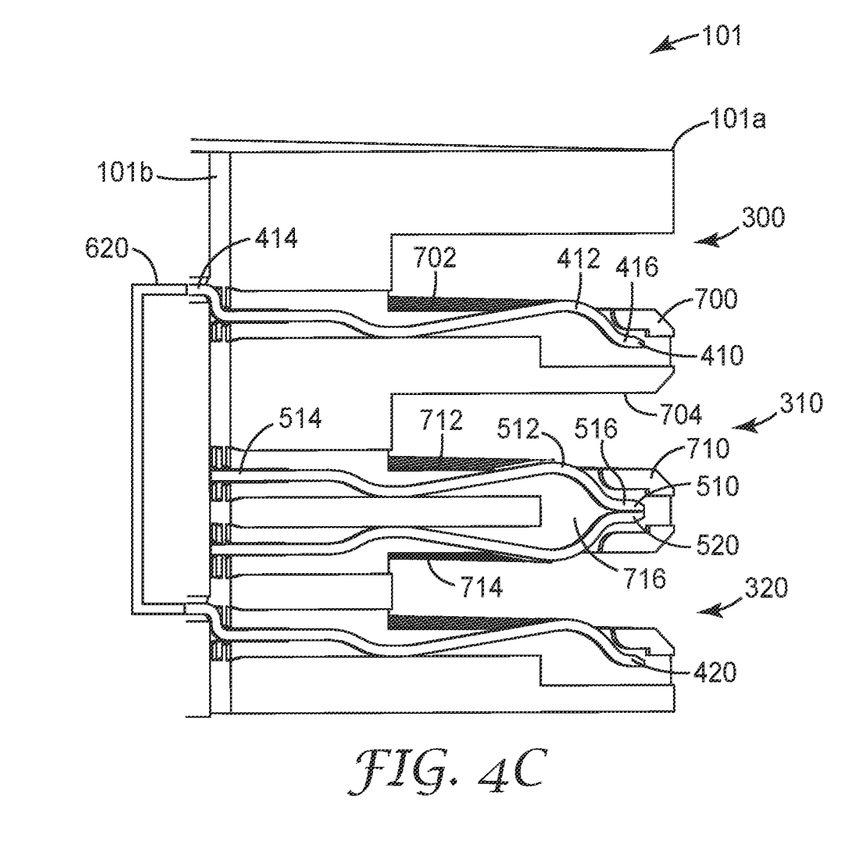
FIG. 4C shows an electrical connector having with a C-shaped portion that electrically connects terminals of the connector.

In some embodiments, each pair 400 of first terminals 410, 420 electrically connects corresponding traces of the first 210 and third 230 PCBs by virtue of a C-shaped joining portion 620 as shown in FIG. 4C. As illustrated in FIG. 4C, connector 101 includes a one or more C-shaped joining portions 620 arranged at the non-mating end 101b between terminals 410 and 420. The C-shaped joining 620 portion extends between first terminals 410, 420. Each C-shaped joining portion 620 corresponds to and electrically interconnects a different pair 400 of first terminals 410, 420. Each pair 400 of first terminals 410, 420 electrically connects corresponding traces of the first 210 and third 230 PCBs by virtue of the corresponding electrically conductive C-shaped joining portion 620. In some implementations, the connector 101 may include a plurality of C-shaped joining portions 620, wherein each portion 620 corresponds to and electrically interconnects a different pair 400 of first terminals 410, 420.

In some embodiments, the pair of first terminals 410, 420 are integrally joined to each other. One or more pairs 400 of the terminals 410, 420 may be integrally joined to each other by the C-shaped joining portion 620. For example, in some embodiments, the first terminals 410, 420 of one or more pairs 400 and the joining portion 620 form a single integral piece.

As illustrated in FIGS. 4A-4C, each first terminal 410, 420 may include a contact portion 412 disposed in the first 300 or third 320 mating slots. The contact portion 412 is configured to make contact with a trace of a PCB received in the first 300 or third 320 mating slot. Each first terminal 410, 420 may include a rear tail portion 414 on one side of the contact portion 412 and connected to an electrically conductive trace 610 or joining portion 620 of the electrical connector. Each first terminal 410, 420 may include a front end portion 416 on an opposite side of the contact portion 412. In this arrangement, the contact portion 412 is disposed between the rear tail portion 414 and the front end portion 416.

As illustrated in FIGS. 4A-4C, according to some embodiments, each second terminal 510, 520 may include a contact portion 512 disposed in the second 310 or third 320 mating slot for making contact with a trace of a PCB received in the second 310 or third 320 mating slot. Each second terminal 510, 520 may include a rear tail portion 514 on one side of the contact portion 512 and a front end portion 516 disposed on an opposite side of the contact portion 512.

In some embodiments, the rear tail portions 514 of the second terminals 510, 520 rest on a surface 514a of the connector 100, 101.

According to some embodiments, connector 100, 101 includes a wall 710 that separates the second mating slot from the third mating slot 320. A row of second flexible terminals 510 are spaced apart and disposed on a first side 712 of the wall 700 and communicate with mating slot 310. A row of second flexible terminals 520 are spaced apart and are disposed on an opposite second side 714 of the wall 700 and communicate with the third mating slot 320. Each flexible terminal 510 in a terminal pair 500 corresponds to a flexible terminal 520 in the terminal pair 500, such that corresponding terminals 510, 520 can resiliently flex toward and make contact with one another through an opening 716 defined within the wall 700.

FIG. 4B shows a connector assembly 1000 comprising a connector 100 and one or more PCBs 200. The connector assembly 1000 includes the electrical connector 100 and at least one PCB 210, 220, 230 inserted into at least one mating slot 300, 310, 320. FIG. 4B shows first 210, second 220, and third 230 PCBs inserted in the respective first 300, second 310, and third 320 mating slots of the connector 100. Each pair 400 of first terminals 410, 420 electrically connects corresponding traces of the first 210 and third 230 PCBs. Each pair of second terminals 500 electrically connects corresponding traces of the second 220 and third 230 PCBs.

FIG. 4B shows the terminals 510, 530 flexing to touch and electrically connect when circuit boards 220 and 230 are installed in mating slots 310, 320. As shown, each pair 500 of second terminals 510, 520 electrically connects corresponding traces of the second and third PCBs 220, 230 by virtue of the second and third PCBs flexing the second terminals 510, 520 in the pair 500 such that the front end portions 516 of the pair 500 of second terminals 510, 520 physically and electrically contact one another. When first, 210, second 220, and third 230 PCBs disposed in the respective first 300, second 310, and third 320 mating slots, each pair 400 of first terminals 410, 420 electrically connects corresponding traces 212, 232 of the first 210 and third 230 PCBs by virtue of conductive trace 610. Each pair 500 of second terminals 510, 520 electrically connects corresponding traces 222, 234 of the second 220 and third 230 PCBs. When the connector is oriented as shown in FIG. 4B, insertion of the second PCB 220 into the second slot 310 causes the second terminals 510 to flex downward along the −z axis. Insertion of the third PCB 230 into the third slot 320 causes the second terminals 520 to flex upward along the +z axis. The second pair 500 of terminals 510, 520 are configured so that the flexing of the terminals 510, 520 causes the contact portions 516 of terminals 510, 520 to make physical and electrical contact. Each second pair 500 of second terminals 510, 520 electrically connect corresponding traces of the second 220 and third 230 PCBs by virtue of the second 220 and third 230 PCBs flexing the second terminals 510, 520 in the pair 500 to physically and electrically contact one another.

Figure 5A:
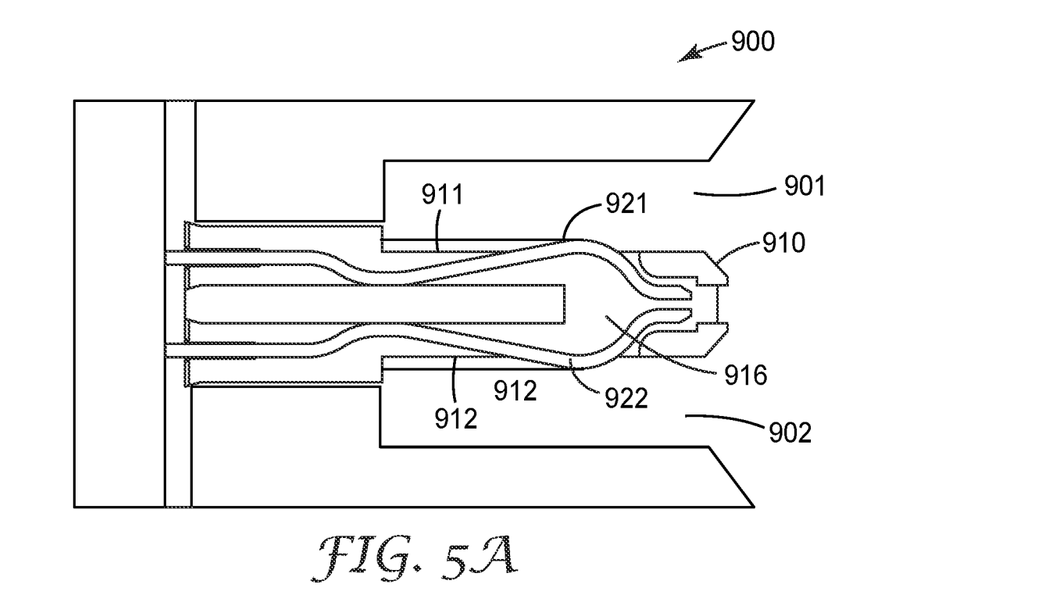
FIG. 5A illustrates an electrical connector in accordance with some embodiments.

FIG. 5A illustrates an electrical connector 900 in accordance with some embodiments. The electrical connector 900 defines first 901 and second 902 mating slots with a wall 910 that separates the first mating slot 901 from the second mating slot 902. A row of spaced apart flexible first terminals 921 is disposed on a first side 911 of the wall 910 and communicate with the first mating slot 901. A row of spaced apart flexible second terminals 922 is disposed on an opposite second side 912 of the wall 910 and communications with the second mating slot 902. Each flexible first terminal 921 corresponds to a flexible second terminal 922, such that corresponding first 921 and second 922 terminals can resiliently flex toward and make contact with one another through an opening 916 defined within the wall 910. Each first 921 and second 922 terminal may be electrically isolated within the electrical connector 900. In some implementations, each first terminal 921 is electrically isolated from all other first terminals 921 and all second terminals 922. In some implementations, each second terminal 922 is electrically isolated from all other second terminals 922 and all first terminals 921.

Figure 5B:
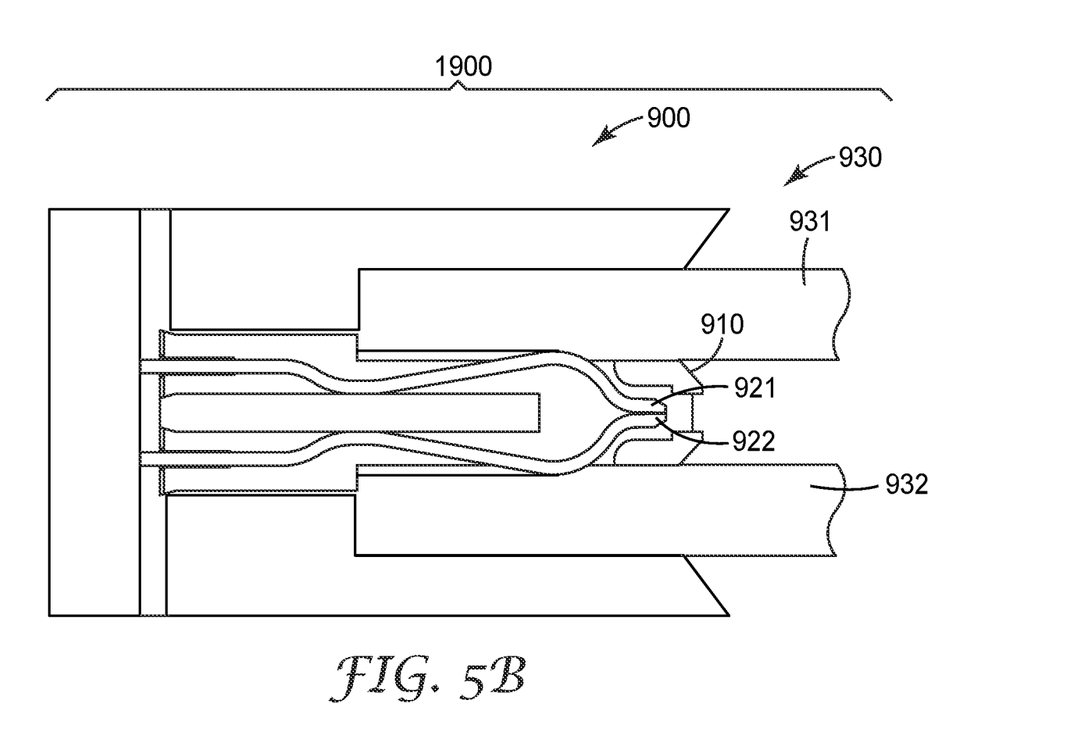
FIG. 5B illustrates an electrical connector assembly comprising the electrical connector of FIG. 5A with PCBs installed in the mating slots in accordance with some embodiments.

FIG. 5B illustrates a connector assembly 1900 that includes connector 900 and PCBs 930 including a first PCB 931 and a second PCB 932. As illustrated in FIG. 5B, when first 931 and second 932 PCBs are received in the respective first 901 and second 902 mating slots, the first 931 and second 932 PCBs flex each corresponding first 921 and second 922 terminal causing the terminals 921, 922 to physically and electrically contact one another. The contacting first 921 and second 922 terminals electrically connect corresponding traces of the first 931 and second 932 PCBs.

Figure 6A:
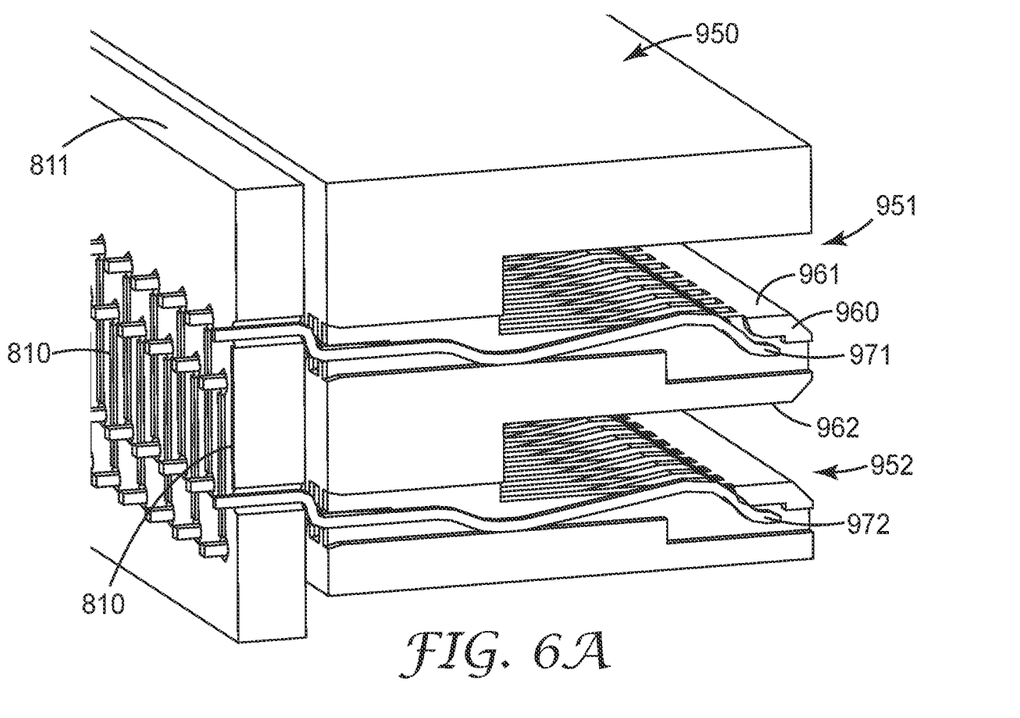
FIG. 6A illustrates an electrical connector in accordance with some embodiments.

FIG. 6A illustrates an electrical connector 950 in accordance with some embodiments. The electrical connector 950 provides for electrical connection between first 981 and second 982 printed circuit boards (shown in FIG. 6B). The connector 950 defines first 951 and second 952 mating slots configured to accept the printed circuit boards 981, 982. Connectors described herein include at least one wall that separates mating slots. For example, FIG. 6A illustrates a connector 950 in which a wall 960 separates the first mating slot 951 from the second mating slot 952. A row of spaced apart flexible first terminals 971 is disposed on a first side 961 of the wall 960 and communicates with the first mating slot 951. A row of spaced apart flexible second terminals 972 are disposed in a position on the opposite second side 962 of the wall 960 and communicates with the second mating slot 952.

Figure 6B:
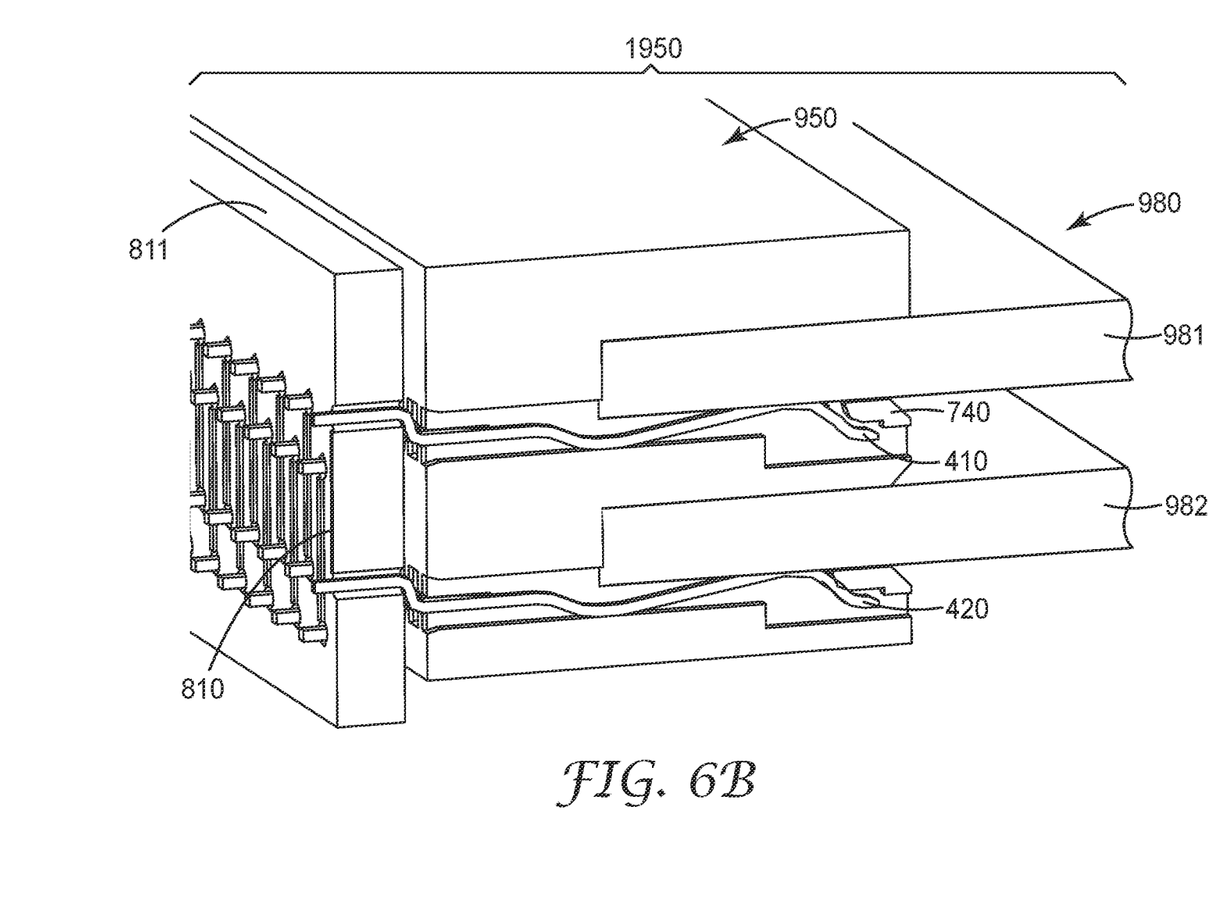
FIG. 6B illustrates and electrical connector assembly comprising the electrical connector of FIG. 6A with PCBs installed in the mating slots in accordance with some embodiments.

Each flexible second terminal 972 corresponds to and is electrically connected to a different flexible first terminal 971. When first 981 and second 982 PCBs shown in FIG. 6B are received in the respective first and second mating slots 951, 952, corresponding first 971 and second 972 terminals electrically connect corresponding traces of the first and second PCBs 981, 982. For example, in some embodiments, when first and second PCBs 981, 982 are received in the respective first 951 and second 952 mating slots, corresponding first 971 and second 972 terminals electrically connect corresponding traces of the first 981 and second 982 PCBs by virtue of an electrically conductive trace 810 extending between and electrically connecting the corresponding first 971 and second 972 terminals. The electrical connector 950 may comprise a bridge circuit board 811 including a plurality of conductive traces 810, wherein each conductive trace 810 corresponds to and electrically interconnects first 971 and second 972 terminals.

In some embodiments, when first and second PCBs 931, 932 are received in the respective first 951 and second 952 mating slots, corresponding first 971 and second 972 terminals electrically connect corresponding traces of the first 931 and second 932 PCBs by virtue of a C-shaped joining portion extending between and electrically connecting the corresponding first 971 and second 972 terminals as previously discussed in connection with FIG. 4C.

FIG. 6B illustrates a connector assembly 1950 comprising the electrical connector 900 and PCBs 980 including first and second PCBs 981, 932 inserted in the respective first and second mating slots 951, 952 of the connector 950. Corresponding first and second terminals 971, 972 electrically connect corresponding traces of the first and second PCBs 931, 932 through the trace 810 on circuit board 811.

Embodiments disclosed herein include:

Embodiment 1

An electrical connector for providing electrical connection between first, second, and third printed circuit boards (PCBs), the connector defining spaced apart substantially parallel, first, second and third mating slots, and comprising:

a plurality of pairs of first terminals, wherein for each pair of first terminals:

the first terminals are electrically connected to each other;

one of the first terminals is disposed in the first mating slot; and the other of the first terminals is disposed in the third mating slot; and a plurality of pairs of second terminals, wherein for each pair of second terminals:

the second terminals are electrically isolated from each other;

one of the second terminals is disposed in the second mating slot; and the other of the second terminals is disposed in the third mating slot, such that when first, second and third PCBs are received in the respective first, second and third mating slots:

each pair of first terminals electrically connects corresponding traces of the first and third PCBs; and each pair of second terminals electrically connects corresponding traces of the second and third PCBs.

Embodiment 2

The electrical connector of embodiment 1, wherein each pair of second terminals electrically connect corresponding traces of the second and third PCBs by virtue of the second and third PCBs flexing the second terminals in the pair to physically and electrically contact one another.

Embodiment 3

The electrical connector of any of embodiments 1 through 2, wherein each pair of first terminals electrically connect corresponding traces of the first and third PCBs by virtue of an electrically conductive trace (610) extending between and electrically connecting the pair of first terminals.

Embodiment 4

The electrical connector of any of embodiments 1 through 3, wherein each pair of first terminals electrically connect corresponding traces of the first and third PCBs by virtue of the pair of first terminals being integrally joined to each other.

Embodiment 5

The electrical connector of embodiment 4, wherein the pair of first terminals are integrally joined to each other by a C-shaped joining portion.

Embodiment 6

The electrical connector any of embodiments 1 through 5, further comprising a plurality of conductors, each conductor corresponding to and electrically interconnecting a different pair of first terminals.

Embodiment 7

The electrical connector of any of embodiments 1 through 6, further comprising a bridge circuit board comprising a plurality of conductive traces, each conductive trace corresponding to and electrically interconnecting a different pair of first terminals.

Embodiment 8

The electrical connector of any of embodiments 1 through 7, wherein a first wall separates the first mating slot from the second mating slot, and a second wall separates the second mating slot from the third mating slot.

Embodiment 9

The electrical connector of any of embodiments 1 through 8, wherein each second terminal is electrically isolated from all other second terminals in the plurality of pairs of second terminals and all first terminals in the plurality of pairs of first terminals.

Embodiment 10

The electrical connector of any of embodiments 1 through 9, wherein each first terminal comprises:

a contact portion disposed in the first or third mating slot for making contact with a trace of a PCB received in the first or third mating slot;

a rear tail portion on a side of the contact portion and connected to an electrically conductive trace of the electrical connector; and a front end portion on an opposite side of the contact portion.

Embodiment 11

The electrical connector of any of embodiments 1 through 10, wherein each second terminal comprises:

a contact portion disposed in the second or third mating slot for making contact with a trace of a PCB received in the second or third mating slot;

a rear tail portion on a side of the contact portion; and a front end portion on an opposite side of the contact portion.

Embodiment 12

The electrical connector of embodiment 11, wherein each pair of second terminals electrically connect corresponding traces of the second and third PCBs by virtue of the second and third PCBs flexing the second terminals in the pair such that the front end portions of the pair of second terminals physically and electrically contact one another.

Embodiment 13

The electrical connector of embodiment 11, wherein the rear tail portions of the second terminals rest on a surface of the connector.

Embodiment 14

A connector assembly, comprising:
the electrical connector of any of embodiments 1 through 13; and
first, second and third PCBs inserted in the respective first, second and third mating slots, each pair of first terminals electrically connecting corresponding traces of the first and third PCBs, each pair of second terminals electrically connecting corresponding traces of the second and third PCBs.

Embodiment 15

An electrical connector defining first and second mating slots and comprising:
a wall separating the first mating slot from the second mating slot;
a row of spaced apart flexible first terminals disposed on a first side of the wall and communicating with the first mating slot; and
a row of spaced apart flexible second terminals disposed on an opposite second side of the wall and communicating with the second mating slot, each flexible first terminal corresponding to a flexible second terminal, such that corresponding first and second terminals can resiliently flex toward and make contact with one another through an opening defined within the wall.

Embodiment 16

The electrical connector of embodiment 15, wherein each first terminal is electrically isolated from all other first terminals and all second terminals.

Embodiment 17

The electrical connector of any of embodiments 15 through 16, wherein each second terminal is electrically isolated from all other second terminals and all first terminals.

Embodiment 18

The electrical connector of any of embodiments 15 through 17, wherein each first and second terminal is electrically isolated within the electrical connector.

Embodiment 19

The electrical connector of any of embodiments 15 through 18, such that when first and second printed circuit boards (PCBs) are received in the respective first and second mating slots, the first and second PCBs flex each corresponding first and second terminals to physically and electrically contact one another, so that the contacting first and second terminals electrically connect corresponding traces of the first and second PCBs.

Embodiment 20

A connector assembly, comprising:
the electrical connector of any of embodiments 15 through 19; and
first and second printed circuit boards (PCBs) inserted in the respective first and second mating slots, the first and second PCBs flex each corresponding first and second terminals to physically and electrically contact one another, so that the contacting first and second terminals electrically connect corresponding traces of the first and second PCBs.

Embodiment 21

An electrical connector for providing electrical connection between first and second printed circuit boards (PCBs), the connector defining first and second mating slots and comprising:
at least one wall separating the first mating slot from the second mating slot;
a row of spaced apart flexible first terminals disposed on a first side of the at least one wall and communicating with the first mating slot; and
a row of spaced apart flexible second terminals disposed on an opposite second side of the at least one wall and communicating with the second mating slot, each flexible second terminal corresponding to and electrically connected to a different flexible first terminal, such that when first and second PCBs are received in the respective first and second mating slots, corresponding first and second terminals electrically connect corresponding traces of the first and second PCBs.

Embodiment 22

The electrical connector of claim 21, such that when first and second PCBs are received in the respective first and second mating slots, corresponding first and second terminals electrically connect corresponding traces of the first and second PCBs by virtue of an electrically conductive trace (610) extending between and electrically connecting the corresponding first and second terminals.

Embodiment 23

The electrical connector of any of embodiments 21 through 22, such that when first and second PCBs are received in the respective first and second mating slots, corresponding first and second terminals electrically connect corresponding traces of the first and second PCBs by virtue of the first and second PCBs flexing the corresponding first and second terminals toward each other to physically and electrically contact one another.

Embodiment 24

The electrical connector of any of embodiments 21 through 23, further comprising a bridge circuit board comprising a plurality of conductive traces, each conductive trace corresponding to and electrically interconnecting corresponding first and second terminals.

Embodiment 25

The electrical connector of any of embodiments 21 through 24, wherein the at least one wall comprises spaced apart first and second walls, a first side of the first wall exposed to the first mating slot, an opposite second side of the first wall facing a first side of the second wall, and an opposite second side of the second wall exposed to the second mating slots.

Embodiment 26

The electrical connector of embodiment 25, wherein:
the row of spaced apart flexible first terminals are disposed on the first side of the first wall and communicating with the first mating slot; and
the row of spaced apart flexible second terminals are disposed on the second side of the second wall and communicating with the second mating slot.

Embodiment 27

The electrical connector of any of embodiments 21 through 26, wherein the at least wall comprises a single wall, a first side of the single wall exposed to the first mating slot, an opposite second side of the single wall exposed to the second mating slots.

Embodiment 28

The electrical connector of embodiment 27, wherein:
the row of spaced apart flexible first terminals are disposed on the first side of the wall and communicating with the first mating slot; and
the row of spaced apart flexible second terminals are disposed on the second side of the wall and communicating with the second mating slot.

Embodiment 29

The electrical connector of embodiment 27 further comprising a bridge circuit board comprising a plurality of conductive traces, each conductive trace corresponding to and electrically interconnecting corresponding first and second terminals.

Embodiment 30

The electrical connector of embodiment 27, such that corresponding first and second terminals can resiliently flex toward and make contact with one another through an opening defined within the wall.

Embodiment 31

A connector assembly, comprising:
the electrical connector of any of embodiments 21 through 30; and
first and second PCBs inserted in the respective first and second mating slots, corresponding first and second terminals electrically connecting corresponding traces of the first and second PCBs.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

Various modifications and alterations of these embodiments will be apparent to those skilled in the art and it should be understood that this scope of this disclosure is not limited to the illustrative embodiments set forth herein. For example, the reader should assume that features of one disclosed embodiment can also be applied to all other disclosed embodiments unless otherwise indicated.

The invention claimed is:

1. An electrical connector defining a first mating slot and a second mating slot and comprising:
   a wall separating the first mating slot from the second mating slot;
   a row of spaced apart flexible first terminals disposed on a first side of the wall and communicating with the first mating slot; and
   a row of spaced apart flexible second terminals disposed on an opposite second side of the wall and communicating with the second mating slot, each flexible first terminal corresponding to a flexible second terminal, such that corresponding first and second terminals can resiliently flex toward and make contact with one another through an opening defined within the wall.

2. The electrical connector of claim 1, such that when first and second printed circuit boards are received in the respective first and second mating slots, the first and second printed circuit boards flex each corresponding first and second terminals to physically and electrically contact one another, so that the contacting first and second terminals electrically connect corresponding traces of the first and second printed circuit boards.

3. An electrical connector for providing electrical connection between a first printed circuit board and a second printed circuit board, the connector defining first and second mating slots and comprising:
   at least one wall separating the first mating slot from the second mating slot;
   a row of spaced apart flexible first terminals disposed on a first side of the at least one wall and communicating with the first mating slot; and
   a row of spaced apart flexible second terminals disposed on an opposite second side of the at least one wall and communicating with the second mating slot, each flexible second terminal corresponding to and electrically connected to a different flexible first terminal, such that when first printed circuit board and second printed circuit board are received in the respective first and second mating slots, corresponding first and second terminals electrically connect corresponding traces of the first and second printed circuit boards.

4. The electrical connector of claim 3 further comprising a bridge circuit board comprising a plurality of conductive traces, each conductive trace corresponding to and electrically interconnecting corresponding first and second terminals.

* * * * *